United States Patent
Kim

(10) Patent No.: US 10,833,126 B2
(45) Date of Patent: Nov. 10, 2020

(54) THREE DIMENSIONAL STACKED SEMICONDUCTOR MEMORY DEVICE

(71) Applicant: SK hynix Inc., Icheon (KR)

(72) Inventor: Seong-Hyun Kim, Suwon-si (KR)

(73) Assignee: SK hynix Inc., Icheon-si (KR)

( * ) Notice: Subject to any disclaimer, the term of this patent is extended or adjusted under 35 U.S.C. 154(b) by 3 days.

(21) Appl. No.: 16/242,858

(22) Filed: Jan. 8, 2019

(65) Prior Publication Data
US 2019/0393270 A1 Dec. 26, 2019

(30) Foreign Application Priority Data
Jun. 26, 2018 (KR) .................. 10-2018-0073179

(51) Int. Cl.
| | | |
|---|---|---|
| *H01L 47/00* | (2006.01) | |
| *H01L 27/24* | (2006.01) | |
| *H01L 45/00* | (2006.01) | |
| *G11C 13/00* | (2006.01) | |

(52) U.S. Cl.
CPC .......... *H01L 27/2481* (2013.01); *H01L 45/06* (2013.01); *H01L 45/08* (2013.01); *H01L 45/1233* (2013.01); *H01L 45/146* (2013.01); *G11C 13/0004* (2013.01); *G11C 13/0007* (2013.01); *G11C 13/0026* (2013.01); *G11C 13/0028* (2013.01); *G11C 2213/32* (2013.01); *G11C 2213/71* (2013.01)

(58) Field of Classification Search
CPC . G11C 11/54; G11C 13/0004; G11C 13/0007; G11C 13/0026; G11C 13/0028; G11C 2213/32; G11C 2213/71; G11C 2213/77; H01L 27/2481; H01L 45/06; H01L 45/08; H01L 45/1233; H01L 45/146
See application file for complete search history.

(56) References Cited

U.S. PATENT DOCUMENTS

| | | | |
|---|---|---|---|
| 7,400,027 B2 | 7/2008 | Joung et al. | |
| 7,433,220 B2 | 10/2008 | Shiimoto et al. | |
| 7,786,548 B2 | 8/2010 | Osano et al. | |
| 2009/0003082 A1* | 1/2009 | Meeks | H01L 27/1052 365/185.28 |
| 2011/0235404 A1* | 9/2011 | Scheuerlein | G11C 7/12 365/148 |
| 2012/0268980 A1 | 10/2012 | Awaya et al. | |
| 2012/0287697 A1* | 11/2012 | Hanzawa | H01L 27/2481 365/148 |

FOREIGN PATENT DOCUMENTS

KR 10-1211027 B1 12/2012

* cited by examiner

*Primary Examiner* — Robert G Bachner

(57) ABSTRACT

A semiconductor memory device may include: a plurality of row lines extended in parallel to each other in a first horizontal direction; a plurality of column line stacks extended in parallel to each other in a second horizontal direction perpendicular to the first horizontal direction, wherein each of the plurality of column line stacks includes a plurality of column lines extended in parallel to each other in a vertical direction; and a plurality of cell pillars that pass vertically through the column lines of the column line stacks, each of the plurality of cell pillars has a first end and a second end, wherein the first ends of the plurality of cell pillars are electrically coupled to the plurality of row lines, and the second ends of the plurality of cell pillars are floated. Each cell pillar includes a core and variable resistance memory layers.

20 Claims, 18 Drawing Sheets

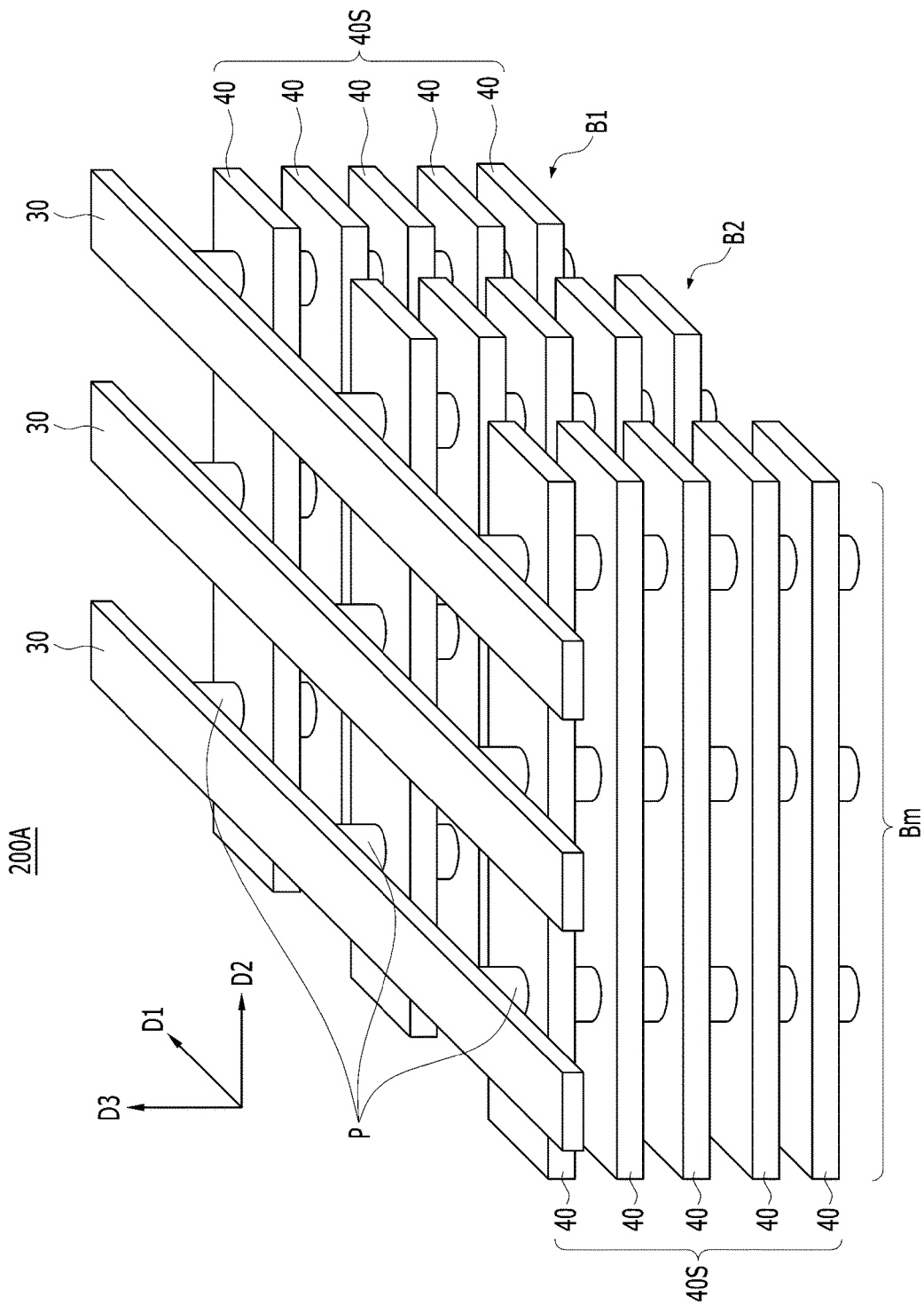

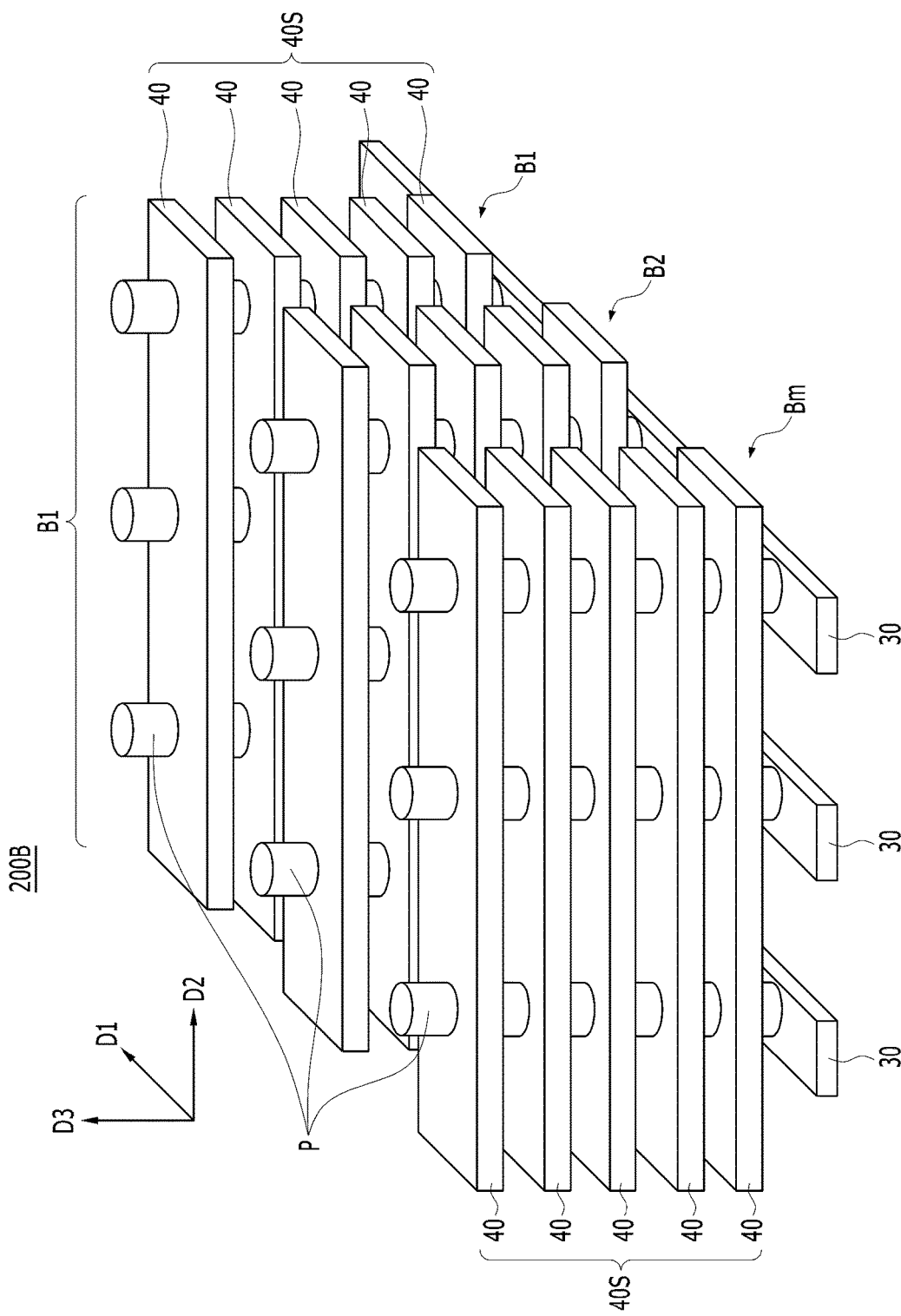

THREE DIMENSIONAL STACKED SEMICONDUCTOR MEMORY DEVICE

CROSS-REFERENCE TO RELATED APPLICATION

This present patent application claims priority under 35 U.S.C. § 119(a) to Korean Patent Application No. 10-2018-0073179 filed on Jun. 26, 2018, which is incorporated herein by reference in its entirety.

BACKGROUND

1. Field

Exemplary embodiments of the present disclosure relate to a three dimensional (3D) stacked semiconductor memory device.

2. Discussion of the Related Art

Recently, much attention has been paid to 3D stacked semiconductor memory technology and cross-point variable resistance memory technology as part of the next-generation of semiconductor memory technology. Furthermore, much attention has also been paid to neuromorphic computing technology that mimics the human brain so as to be used for the artificial intelligence technology or the like. A neuromorphic device based on neuromorphic technology includes a plurality of pre-synaptic neurons, a plurality of post-synaptic neurons and a plurality of synapses. The neuromorphic device may have various resistance levels depending on learned states, and may output various voltages or currents according to the resistance levels.

SUMMARY

Embodiments of the present disclosure include a semiconductor memory device and a neuromorphic device, which have a plurality of variable resistance layers to implement multiple resistance levels.

Embodiments of the present disclosure include a cross-point semiconductor memory device and a neuromorphic device.

Embodiments of the present disclosure include a 3D stacked semiconductor memory device and a neuromorphic device.

Embodiments of the present disclosure include a cross-point 3D stacked semiconductor memory device having a plurality of variable resistance layers and a neuromorphic device.

In an embodiment, a semiconductor memory device may include a plurality of row lines extended in parallel to each other in a first horizontal direction; a plurality of column line stacks extended in parallel to each other in a second horizontal direction perpendicular to the first horizontal direction, wherein each of the plurality of column line stacks includes a plurality of column lines extended in parallel to each other in a vertical direction; and a plurality of cell pillars that pass vertically through the column lines of the column line stacks, each of the plurality of cell pillars has a first end and a second end. The first ends of the plurality of cell pillars may be electrically coupled to the plurality of row lines. The second ends of the plurality of cell pillars may be floated.

The second ends of the plurality of cell pillars may protrude from the lowermost column lines of the plurality of column line stacks.

Each of the plurality of cell pillars may include: a central core; and a memory layer surrounding the core.

The central core may include at least one of a metal, metal compound, and metal silicide.

The central core may include at least one of a metal, a metal compound, a metal silicide, and an ion doped silicon.

The central core may be directly connected to one of the plurality of row lines.

The memory layer may include at least three resistance layers. The variable resistance layers may have at least one different characteristics among energy band gaps, chemical potentials, ion mobilities, filament formation threshold voltages, phase change threshold voltages, and atom transfer threshold voltages.

Each of the variable resistance layers may include at least one of metal oxides or high dielectric constant (high-k) oxides containing oxygen vacancies, which include hafnium oxide, aluminum oxide, lanthanum oxide, tantalum oxide, silicon oxide, and titanium oxide.

Each of the plurality of column lines may include at least one of a metal, a metal compound, a metal silicide, and an ion doped silicon.

The plurality of row lines may be buried in a substrate.

In an embodiment, a semiconductor memory device may include: a word line extended in a first horizontal direction; a bit line stack extended in a second horizontal direction perpendicular to the first horizontal direction; and a cell pillar extended from the word line so as to vertically pass through the bit line stack, wherein a first end of the cell pillar is electrically coupled to the word line, and a second end of the cell pillar floats.

The bit line stack may include a plurality of bit lines which are stacked in a vertical direction and extended in parallel to each other in the second horizontal direction.

The bit lines may include at least one of a metal, a metal compound, a metal silicide, and an ion doped silicon.

The second end may protrude from the lowermost end of the column line stack.

The cell pillar may include a central core and memory layers surrounding the core.

The memory layer may include at least three resistance layers. The variable resistance layers may have at least one different characteristic among energy band gaps, chemical potentials, ion mobilities, filament formation threshold voltages, phase change threshold voltages, and atom transfer threshold voltages.

The variable resistance layers may include at least one of metal oxides or high-k oxides containing oxygen vacancies, which include hafnium oxide, aluminum oxide, lanthanum oxide, tantalum oxide, silicon oxide, and titanium oxide.

The word line may include at least one of a metal, a metal compound, a metal silicide, and an ion doped silicon.

In an embodiment, a semiconductor memory device may include: a substrate; a lower insulating layer disposed over the substrate; a plurality of bit lines and a plurality of interlayer dielectric layers which are alternately stacked over the lower insulating layer, wherein the plurality of bit lines are extended in parallel to each other in a first horizontal direction; an upper insulating layer disposed over the plurality of bit lines; a word line disposed over the upper insulating layer and extended in a second horizontal direction perpendicular to the first horizontal direction; and a vertical pillar disposed vertically from the word line through the upper insulating layer, the plurality of interlayer dielectric layers and the plurality of bit lines, wherein the vertical pillar includes a conductive core and three or more variable resistance layers surrounding the core, an upper end of the vertical pillar is directly connected to the word line; and a lower end of the vertical pillar protrudes into the lower insulating layer not to abut on the substrate.

The variable resistance layers may include at least one of various metal oxides or high-k oxides containing oxygen vacancies, which include hafnium oxide, aluminum oxide, lanthanum oxide, tantalum oxide, and titanium oxide. The variable resistance layers may have at least one different characteristic among energy band gaps, chemical potentials, ion mobilities, filament formation threshold voltages, magnetization threshold voltages, phase change threshold voltages, and atom transfer threshold voltages.

BRIEF DESCRIPTION OF THE DRAWINGS

FIGS. 10A and 10B are 3D perspective views schematically illustrating cell arrays of semiconductor memory devices in accordance with embodiments.

DETAILED DESCRIPTION

Figure 1:
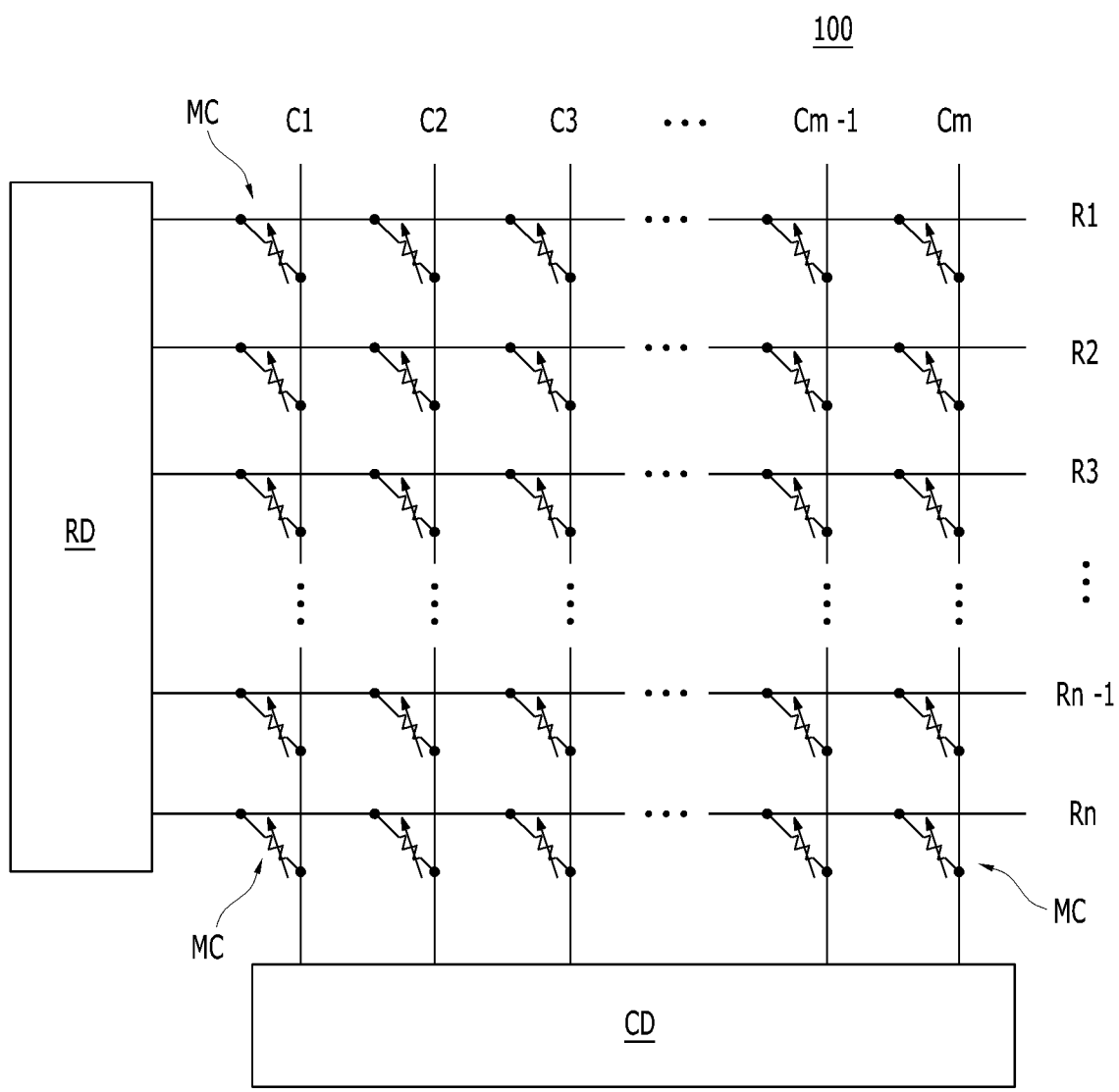
FIG. 1 is a block diagram schematically illustrating a cell array of a semiconductor memory device in accordance with an embodiment.

The advantages and characteristics of the present disclosure and a method for achieving the advantages and characteristics will be clear with reference to the following embodiments together with the accompanying drawings. However, the present disclosure may be embodied in different forms and should not be construed as limited to the embodiments set forth herein. Rather, these embodiments are provided so that this disclosure will be thorough and complete, and will fully convey the scope of the present disclosure to those skilled in the art. The present disclosure is only defined by the scope of claims.

Throughout the specification, like reference numerals refer to like elements. Therefore, although the same or similar reference numerals are not mentioned or described in the corresponding drawing, the reference numerals may be described with reference to other drawings. Furthermore, although elements are not represented by reference numerals, the elements may be described with reference to other drawings.

FIG. 1 is a block diagram conceptually illustrating a cell array 100 of a semiconductor memory device in accordance with an embodiment.

Referring to FIG. 1, the cell array 100 of the semiconductor memory device may include a row driver RD, a column driver CD, a plurality of row lines R1 to Rn, a plurality of column lines C1 to Cm and a plurality of memory cells MC. The plurality of row lines R1 to Rn may be extended in parallel to each other in a row direction from the row driver RD, the plurality of column lines C1 to Cm may be extended in parallel to each other in a column direction from the column driver CD, and the plurality of memory cells MC may be arranged at the respective intersections between the row lines R1 to Rn and the column lines C1 to Cm. The plurality of row lines R1 to Rn may correspond to word lines, and the plurality of column lines C1 to Cm may correspond to bit lines. The plurality of memory cells MC may include variable resistance layers. The plurality of memory cells MC may include first electrodes which are electrically coupled to the respective row lines R1 to Rn and second electrodes which are electrically coupled to the respective column lines C1 to Cm.

The cell array 100 may have a cross-point connection structure. The semiconductor memory device may include a variable resistance memory device such as a resistive random access memory (ReRAM), phase changeable RAM (PCRAM) or conductive bridge RAM (CBRAM). In the present embodiment, the row lines R1 to Rn may correspond to word lines, and the column lines C1 to Cm may correspond to bit lines.

In another embodiment, the cell array 100 of the semiconductor memory device may correspond to a synapse array of a neuromorphic device. For example, the row driver RD may correspond to a pre-synaptic neuron of the neuromorphic device, the column driver CD may correspond to a post-synaptic neuron of the neuromorphic device, the row lines R1 to Rn may correspond to pre-synaptic lines of the neuromorphic device, the column lines C1 to Cm may correspond to post-synaptic lines of the neuromorphic device, and the memory cells MC may correspond to synapses of the neuromorphic device.

Figure 2:
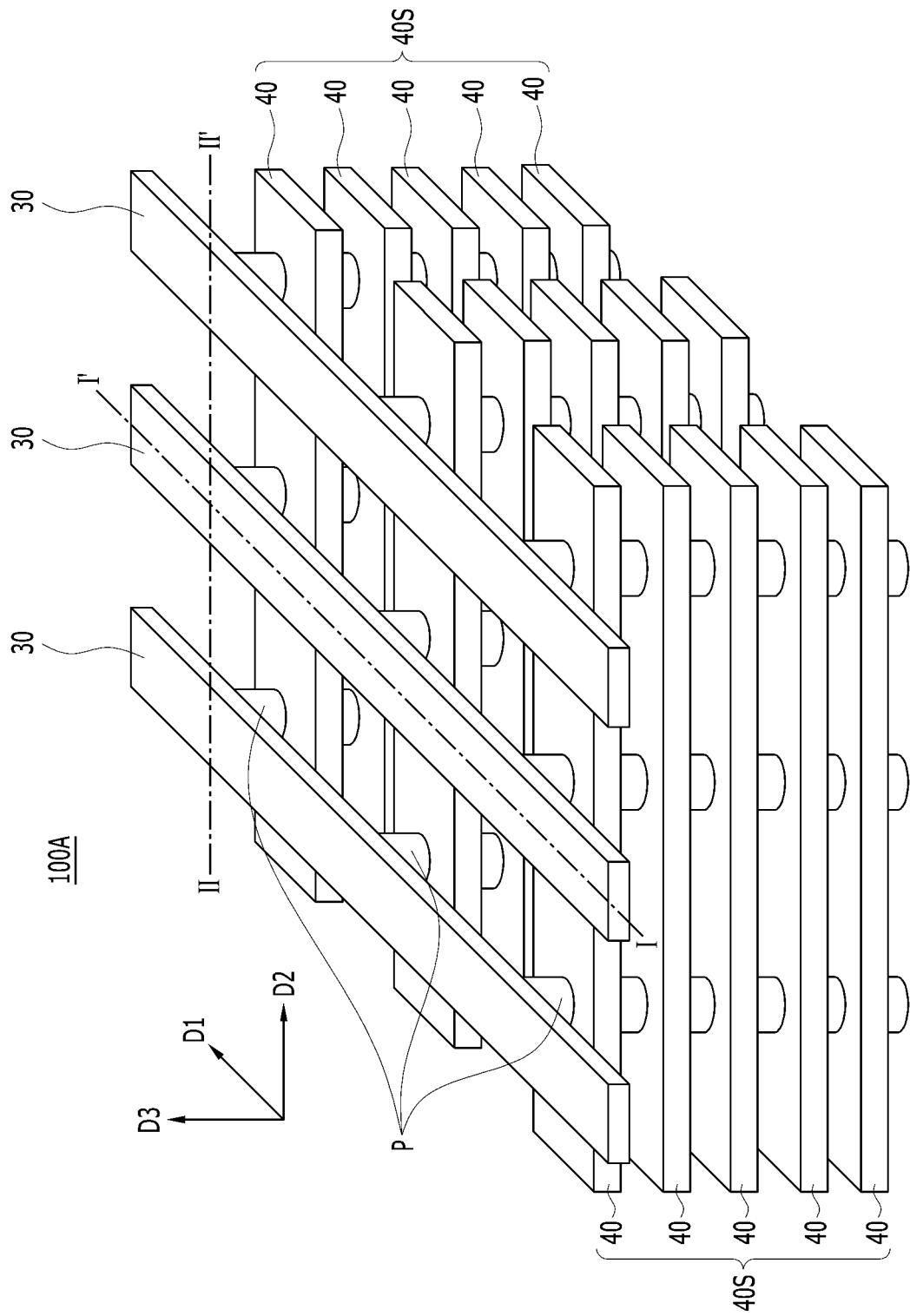
FIG. 2 is a 3D perspective view schematically illustrating a cell array of a semiconductor memory device in accordance with an embodiment.

FIG. 2 is a 3D perspective view schematically illustrating a cell array 100A of a semiconductor memory device in accordance with an embodiment.

Referring to FIG. 2, the cell array 100A of the semiconductor memory device may include a plurality of word lines 30, a plurality of bit lines 40, and a plurality of cell pillars P. The word lines 30 may be extended in parallel to each other in a first direction D1. The first direction D1 may correspond to a horizontal row direction. The bit lines 40 may be configured as a plurality of bit line stacks 40S extended in a second direction D2. That is, each of the bit line stacks 40S may have a plurality of bit lines 40. The second direction D2 may correspond to a horizontal column direction. The plurality of cell pillars P may be extended in a third direction D3 and pass through the bit lines 40. The third direction D3 may correspond to a substantially vertical direction. That is, the plurality of cell pillars P may have a cylinder-like shape and may extend substantially vertically from the word lines 30. The plurality of cell pillars P may be electrically and directly coupled to the word lines 30. Since the cell pillars P pass vertically through the bit line stacks 40S, one of the bit line stacks 40S may be electrically coupled to a plurality of cell pillars P.

The word lines 30 may be arranged over the bit line stacks 40S and the cell pillars P. The upper ends of the plurality of cell pillars P may be electrically coupled to the respective word lines 30, and the lower ends of the plurality of cell pillars P may protrude downward from the lowermost bit lines 40 of the bit line stacks 40S, and float from the word lines 30 and the bit lines 40. That is, the lower ends of the plurality of cell pillars P are not necessarily coupled to other conductive components.

Figure 3A:
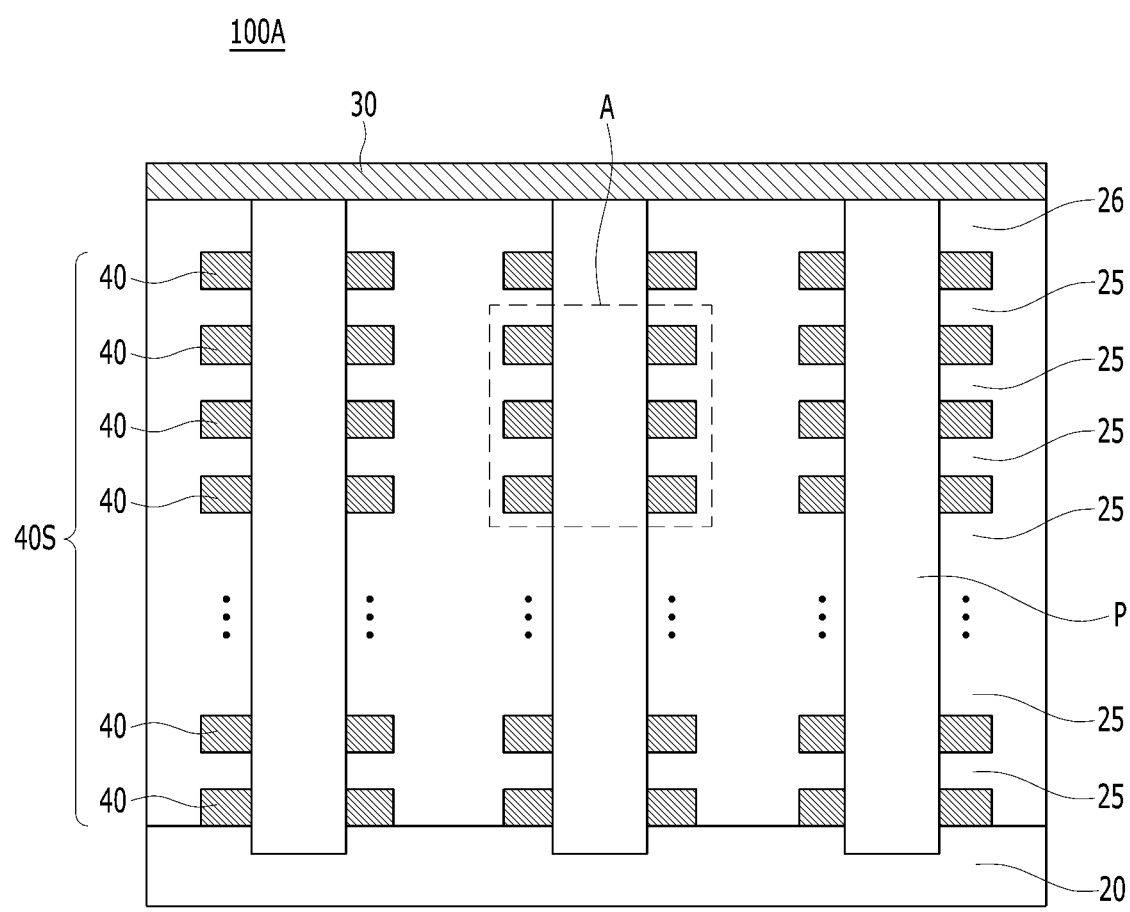
FIG. 3A is a schematic cross-sectional view of the semiconductor memory device, taken along the line I-I' of FIG. 2.
Figure 3B:
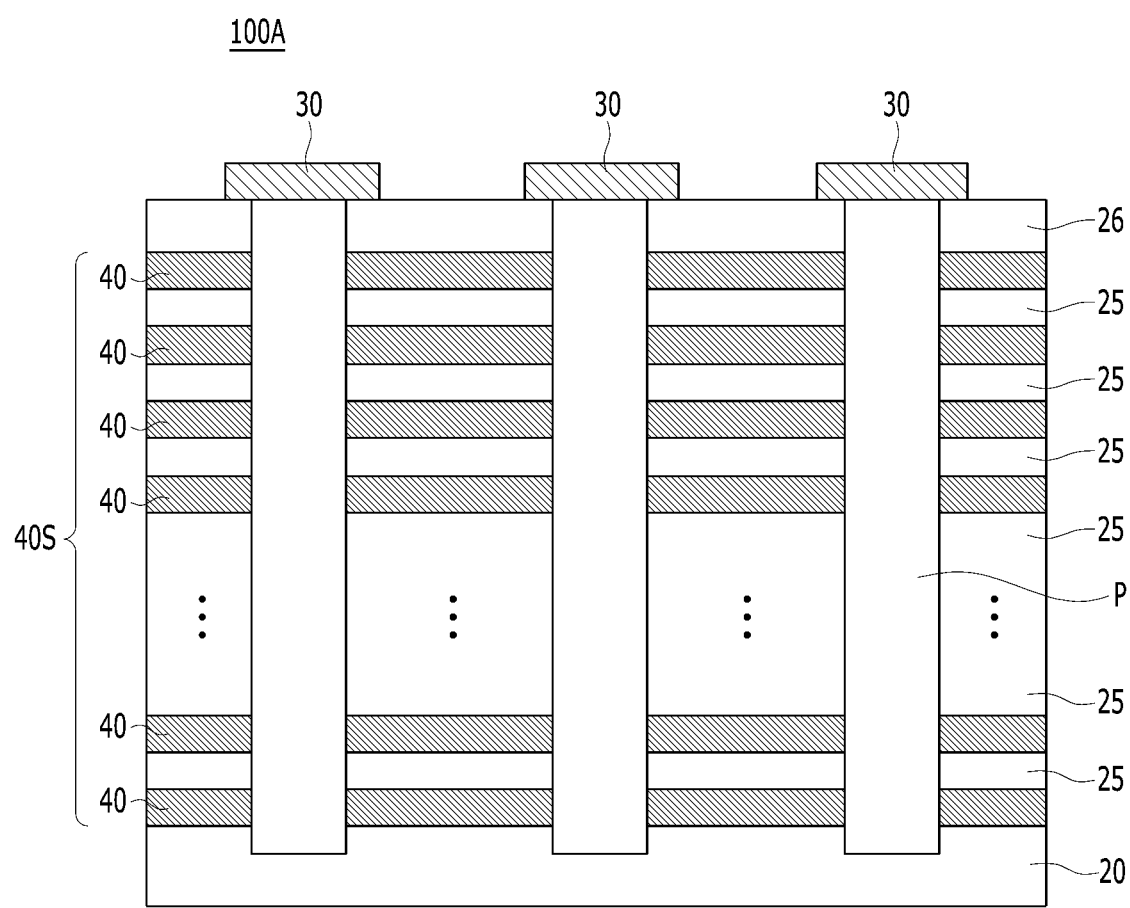
FIG. 3B is a schematic cross-sectional view of the semiconductor memory device, taken along the line II-II' of FIG. 2.

FIG. 3A is a schematic cross-sectional view of the semiconductor memory device, taken along the line I-I' of FIG. 2, and FIG. 3B is a schematic cross-sectional view of the semiconductor memory device, taken along the line II-II' of FIG. 2.

Referring to FIGS. 3A and 3B, the cell array 100A of the semiconductor memory device in accordance with the present embodiment may include a lower insulating layer 20 disposed on a substrate 10, bit line stacks 40S stacked over the lower insulating layer 20, the cell pillars P, and the word lines 30. Each of the bit line stacks 40S may have a plurality of bit lines 40 which are extended in parallel to a horizontal direction. Between the respective stacked bit lines 40, a plurality of interlayer dielectric layers 25 may be interposed. Therefore, the bit lines 40 and the interlayer dielectric layers 25 may be alternately stacked over the substrate 10 and the lower insulating layer 20. Between the bit line stacks 40S and the word lines 30, an upper insulating layer 26 may be disposed.

The substrate 10 may include a bulk semiconductor wafer such as single crystal silicon or a semiconductor layer such as epitaxially-grown single crystal silicon.

The lower insulating layer 20 may include silicon oxide, silicon nitride or a combination thereof. The lower insulating layer 20 may electrically insulate the substrate 10 from the bit lines 40, and electrically insulate the substrate 10 from the cell pillars P.

The plurality of cell pillars P may be extended in the substantially vertical direction to vertically pass through the bit lines 40. The upper ends of the cell pillars P may be directly and electrically coupled to the respective word lines 30, and the lower ends of the cell pillars P may float. That is, the lower ends of the cell pillars P may not be electrically and physically coupled to the substrate 10 or other conductive components. The cell pillars P may pass through the upper insulating layer 26 and the interlayer dielectric layers 25, and partially protrude into the lower insulating layer 20. The lower ends of the plurality of cell pillars P may protrude downward from the lowermost bit lines 40 of the bit line stacks 40S.

The word lines 30 may be arranged on the cell pillars P to be electrically coupled to the cell pillars P. The word lines 30 may be extended in a substantially horizontal direction substantially perpendicular to the bit lines 40. For example, the word lines 30 may be extended in the first horizontal direction, and the bit lines 40 may be extended in the second substantially horizontal direction substantially perpendicular to the first horizontal direction. The word lines 30 may include a conductor. For example, the word lines 30 may include one of: a metal such as tungsten (W), ruthenium (Ru), copper (Cu) or aluminum (Al); a metal compound such as tungsten nitride (WN), titanium nitride (TiN), tantalum nitride (TaN) or ruthenium oxide ($RuO_2$); a metal silicide such as tungsten silicide (WSi), titanium silicide (TiSi), nickel silicide (NiSi) or cobalt silicide (CoSi); or an ion doped silicon.

The bit lines 40 may include a conductor. For example, the bit lines 40 may include one of: a metal such as W, Ru or iridium (Ir); a metal compound such as WN, TiN, TaN or $RuO_2$; a metal silicide such as WSi, TiSi, NiSi or CoSi; or an ion doped silicon.

The plurality of interlayer dielectric layers 25 may include an insulating material such as silicon oxide or silicon nitride to electrically insulate the bit lines 40. The upper insulating layer 26 may include an insulating material such as silicon oxide or silicon nitride to electrically insulate the bit line stacks 40S and the word lines 30 from each other.

Figure 4A:
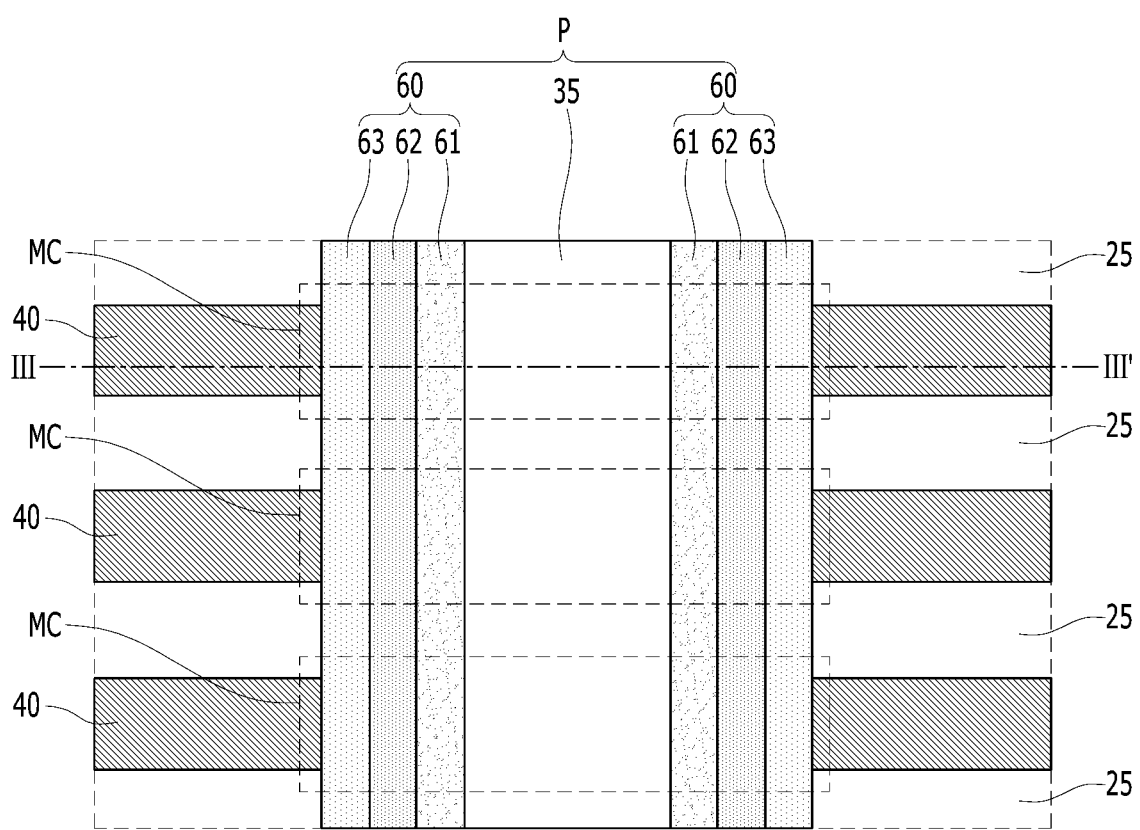
FIG. 4A is an expanded view of a region 'A' in FIG. 3.
Figure 4B:
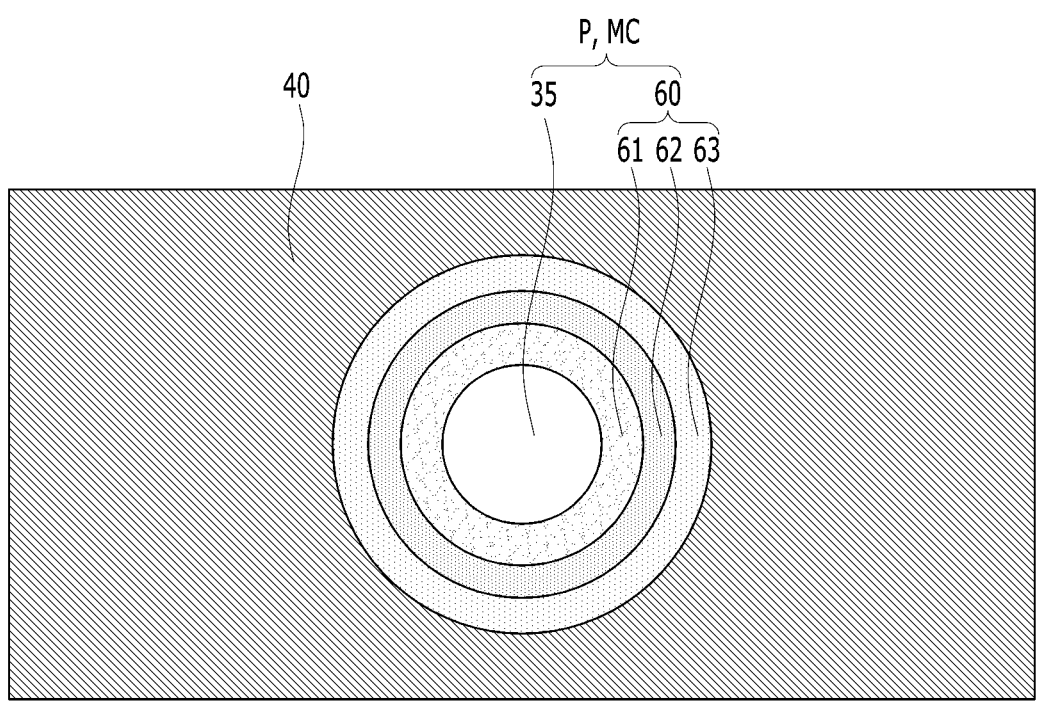
FIG. 4B is a schematic cross-sectional view taken along the line III-III' of FIG. 4A.

FIG. 4A is an expanded view of a region 'A' in FIG. 3, and FIG. 4B is a cross-sectional view taken along the line III-III' of FIG. 4A. Referring to FIGS. 4A and 4B, the cell pillar P may include a central core 35 and a memory layer 60 around the core 35. A part of the core 35 and a part of the memory layer 60 may form one memory cell MC. For example, the cell pillar P may include a plurality of stacked memory cells MC, and each of the memory cells MC may include the central core 35 and the memory layer 60 surrounding the core 35.

The core 35 may be directly and electrically coupled to the word line 30. The core 35 may include a conductor. For example, the core 35 may include one of: a metal such as W, Ru, Cu or Al; a metal compound such as WN, TiN, TaN or $RuO_2$; a metal silicide such as WSi, TiSi, NiSi or CoSi; or an ion doped silicon.

The memory layer 60 may include three or more layers, for example, first to third variable resistance layers 61 to 63. The first to third variable resistance layers 61 to 63 may have one or more different characteristics among energy band gaps, chemical potentials, ion mobility, filament formation threshold voltages, phase change threshold voltages and atom transfer threshold voltages. For example, the first variable resistance layer 61 may have the largest energy band gap, chemical potential, filament formation threshold voltage, phase change threshold voltage or atom transfer threshold voltage, and the third variable resistance layer 63 may have the smallest energy band gap, chemical potential, filament formation threshold voltage, phase change threshold voltage or atom transfer threshold voltage. In another example, the first variable resistance layer 61 may have the lowest ion mobility, and the third variable resistance layer 63 may have the highest ion mobility. The electrical resistance of the first variable resistance layer 61 may be the most difficult to change, and the electrical resistance of the third variable resistance layer 63 may be the least difficult to change among the three layers. For example, when the semiconductor memory device is a ReRAM or CBRAM, a conductive filament may be formed with the most difficulty in the first variable resistance layer 61, and formed with the least difficulty in the third variable resistance layer 63. In other words, the first variable resistance layer 61 may have the highest filament formation threshold voltage, the third variable resistance layer 63 may have the lowest filament formation threshold voltage, and the second variable resistance layer 62 may have a filament formation threshold that falls between that of the other two layers.

The first to third variable resistance layers 61 to 63 may include various metal oxides containing oxygen vacancies, high dielectric constant (high-k) oxide or combinations thereof. The various metal oxides may include hafnium oxide ($HfO_2$), aluminum oxide ($Al_2O_3$), lanthanum oxide ($La_2O_3$), tantalum oxide ($Ta_2O_5$), silicon oxide ($SiO_2$), and titanium oxide ($TiO_2$).

Figure 5A:
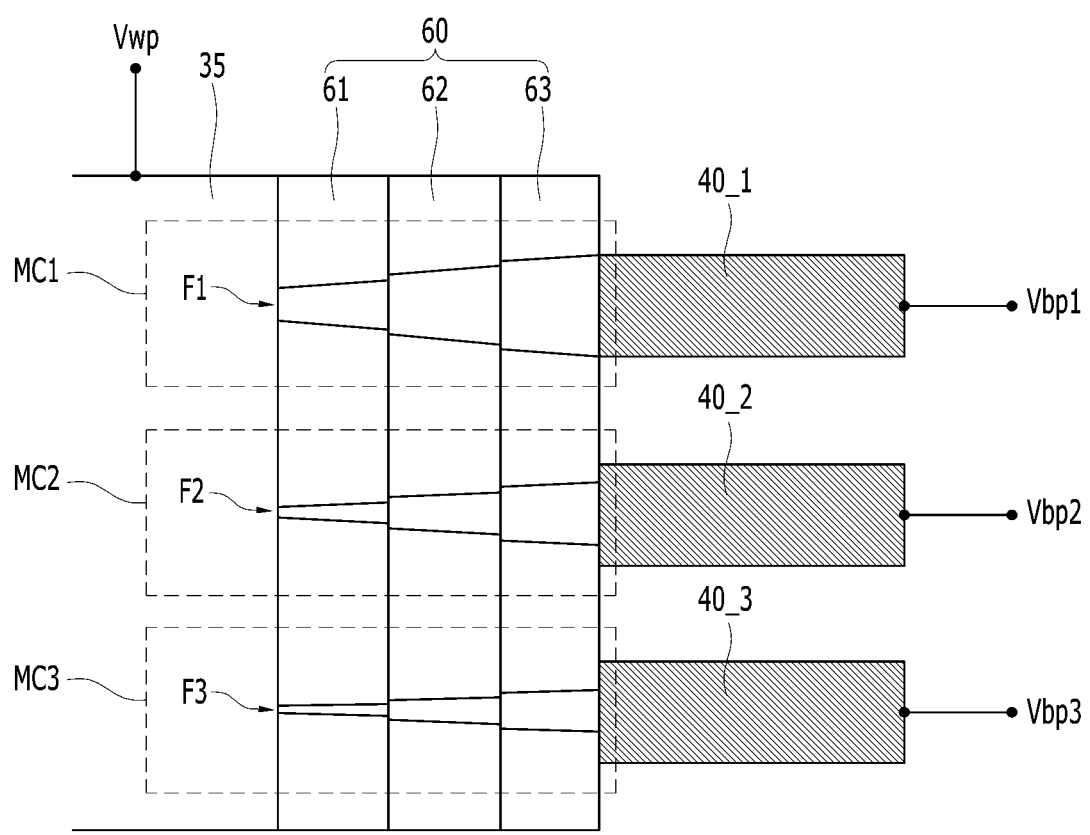
FIGS. 5A and 5B schematically illustrate the principle of a programming operation of the semiconductor memory device.
Figure 5B:
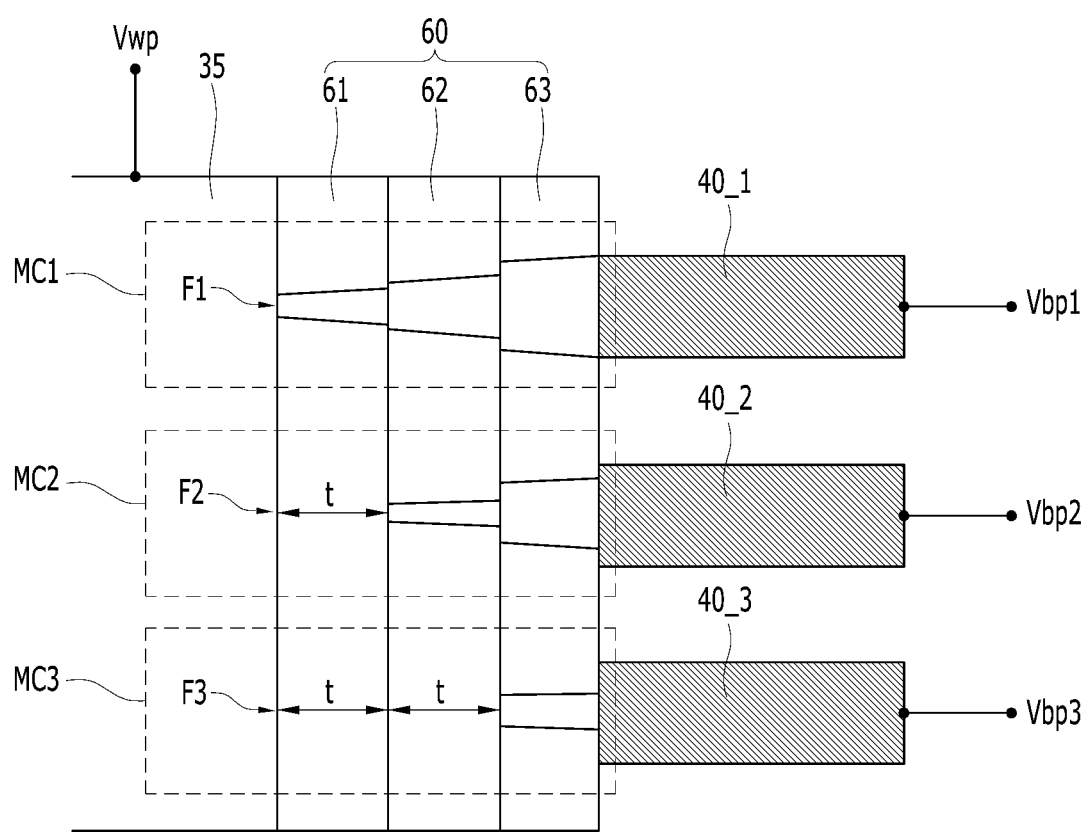

FIGS. 5A and 5B illustrate the principle of a programming operation of the semiconductor memory device. For example, three memory cells MC1 to MC3 and three bits lines 40_1 to 40_3 will be described.

Referring to FIGS. 5A and 5B, a word line program voltage Vwp may be applied to the word line 30 of the semiconductor memory device, i.e. the core 35, a first bit line program voltage Vbp1 may be applied to the first bit line 40_1, a second bit line program voltage Vbp2 may be applied to the second bit line 40_2, and a third bit line program voltage Vbp3 may be applied to the third bit line 40_3, in order to program the memory cells MC1 to MC3 to have different data values, for example, different resistance levels, during a program operation of the semiconductor memory device.

The following descriptions may be based on the supposition that a difference between the word line program voltage Vwp and the first bit line program voltage Vbp1 is the largest, and a difference between the word line program voltage Vwp and the third bit line program voltage Vbp3 is the smallest. That is, a relation of (|Vwp−Vbp1|>|Vwp−Vbp2|>|Vwp−Vbp3|) assumed for the purposes of the descriptions. For example, when all of the program voltages Vwp, Vbpp1, Vbp2, and Vbp3 have positive values (+), the first bit line program voltage Vbp1 may have the lowest value, and the third bit line program voltage Vbp3 may have the highest value.

A first filament F1 having the largest size may be formed in the first memory cell MC1 to which the largest voltage difference is applied, a third filament F3 having the smallest size may be formed in the third memory cell MC3 to which the smallest voltage difference is applied, and a second filament F2 having a medium size may be formed in the second memory cell MC2 to which a medium voltage difference is applied, where a medium size or value is a size or value that falls between the highest and lowest sizes or values. In the present embodiment, it has been assumed and described that the memory cells MC1 to MC3 are memory cells of a ReRAM or CBRAM. When the memory cells MC1 to MC3 are memory cells of a PCRAM, the filaments F1 to F3 may correspond to phase changed regions.

As described above, when the first variable resistance layer 61 has the highest energy band gap, chemical potential, filament formation threshold voltage, phase change threshold voltage or atom transfer threshold voltage and the lowest ion mobility, and when the third variable resistance layer 63 has the lowest energy band gap, chemical potential, filament formation threshold voltage, phase change threshold voltage or atom transfer threshold voltage and the highest ion mobility, the first to third variable resistance layers 61 to 63 may form conductive filaments having different sizes at the same word line program voltage. Specifically, the filament formed in the first variable resistance layer 61 having the highest threshold voltage may have the smallest size, and the filament formed in the third variable resistance layer 63 having the lowest threshold voltage may have the largest size. Therefore, during a read operation of the semiconductor memory device, the first memory cell MC1 may have the lowest resistance value, and the third memory cell MC3 may have the highest resistance value, and the second memory cell MC2 may have an intermediate resistance value between the lowest resistance value and the highest resistance values.

Referring to FIG. 5B, in another example, the first filament F1 may include filaments formed in the first to third variable resistance layers 61 to 63 in the first memory cell MC1 to which the largest voltage difference is applied, the second filament F2 may include filaments formed in the second and third variable resistance layers 62 and 63 in the second memory cell MC2 to which the medium voltage difference is applied, and the third filament F3 may include a filament formed only in the third variable resistance layer 63 in the third memory cell MC3 to which the smallest voltage difference is applied. In the first variable resistance layer 61 of the second memory cell MC2 and in the first and second variable resistance layers 61 and 62 of the third memory cell MC3, in which no filaments are formed, electron tunneling may occur depending on voltage differences among read voltages applied to the core 35 (i.e. the word line 30) and the bit lines 40_1 to 40_3. Therefore, during a read operation of the semiconductor memory device, the first memory cell MC1 may have the lowest resistance value, and the third memory cell MC3 may have the highest resistance value, and the second memory cell MC2 may have an intermediate resistance value between the lowest resistance value and the highest resistance values In accordance with an embodiment, the memory cells MC1 to MC3 may have variable resistance levels depending on voltage differences between the word line program voltage Vwp and the bit line program voltages Vbp1 to Vbp3. For example, in the case of a neuromorphic device, the memory cells MC1 to MC3 may have variable learning levels depending on voltage differences between the word line program voltage Vwp and the bit line program voltages Vbp1 to Vbp3.

In the present embodiment, it has been described that the memory layer 60 includes three variable resistance layers 61 to 63. However, the memory layer 60 may include four or more variable resistance layers. That is, the memory layer 60 may have at least three variable resistance layers, or three or more variable resistance levels, to provide additional resistance levels.

Figure 6:
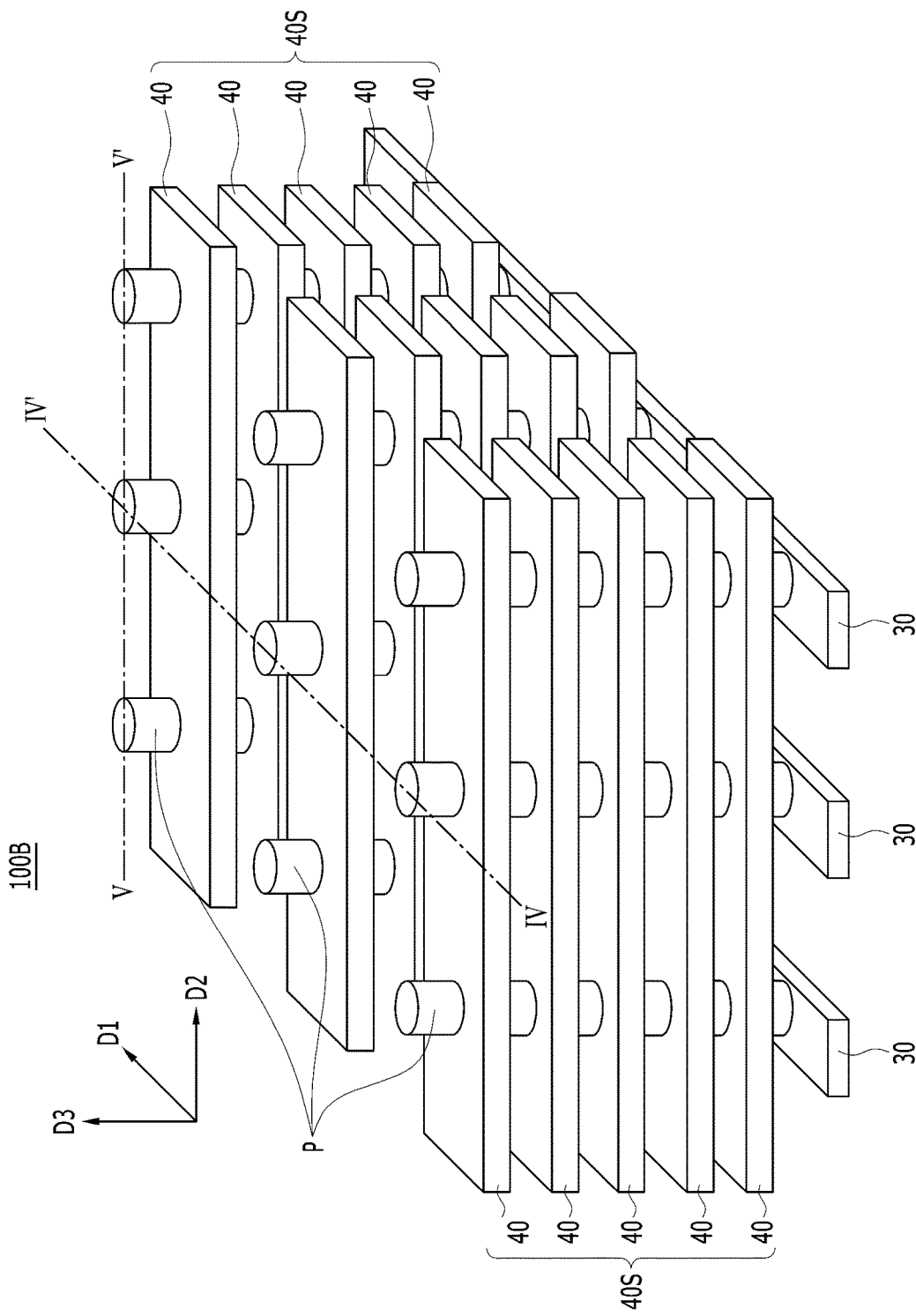
FIG. 6 is a 3D perspective view schematically illustrating a cell array of a semiconductor memory device in accordance with embodiments of the present disclosure.

FIG. 6 is a 3D perspective view schematically illustrating a cell array 100B of a semiconductor memory device in accordance with an embodiment. Referring to FIG. 6, the cell array 100B of the semiconductor memory device may include a plurality of word lines 30, a plurality of bit lines 40, and a plurality of cell pillars P. Compared to the cell array 100A of the semiconductor memory device illustrated in FIG. 2, the plurality of word lines 30 may be arranged under the plurality of bit lines 40 and the plurality of cell pillars P. That is, the lower ends of the cell pillars P may be electrically coupled to the respective word lines 30, and the upper ends of the cell pillars P may float.

Figure 7A:
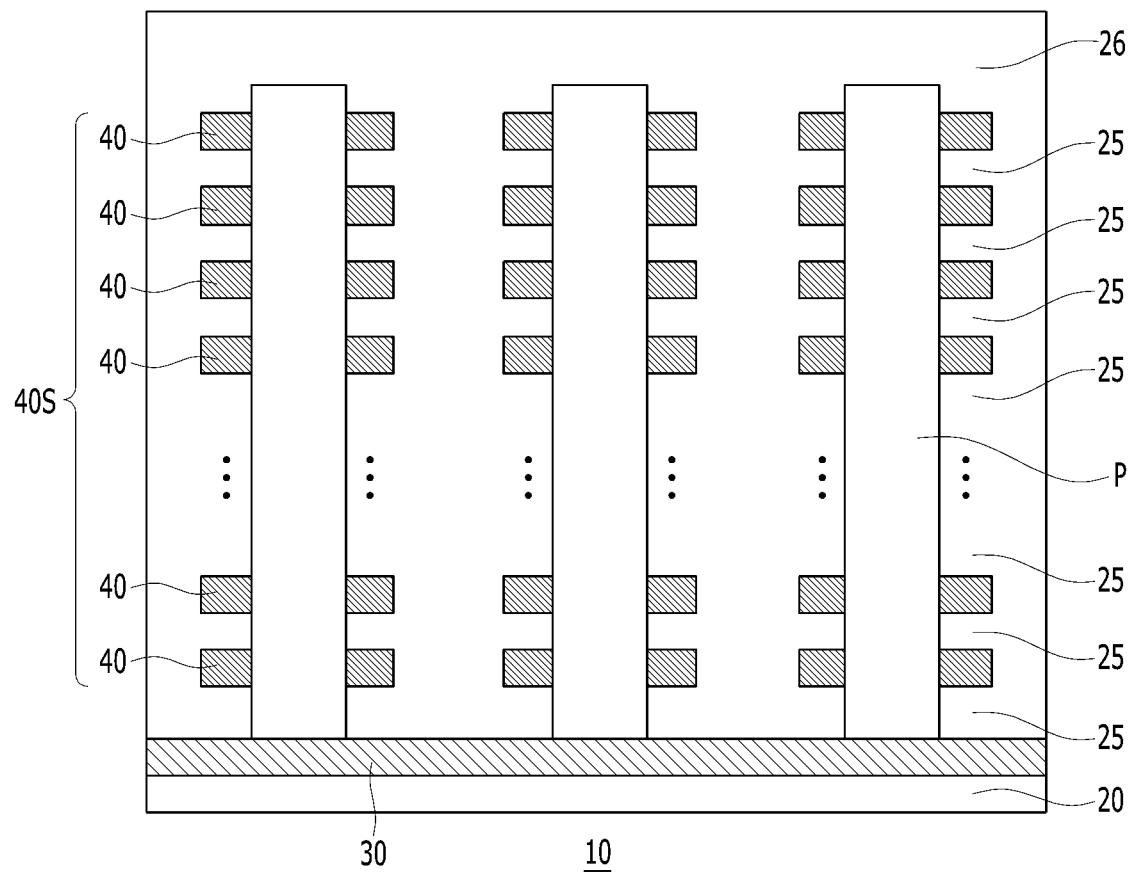
FIG. 7A is a schematic cross-sectional view of a semiconductor memory device, taken along the line IV-IV' of FIG. 6.
Figure 7B:
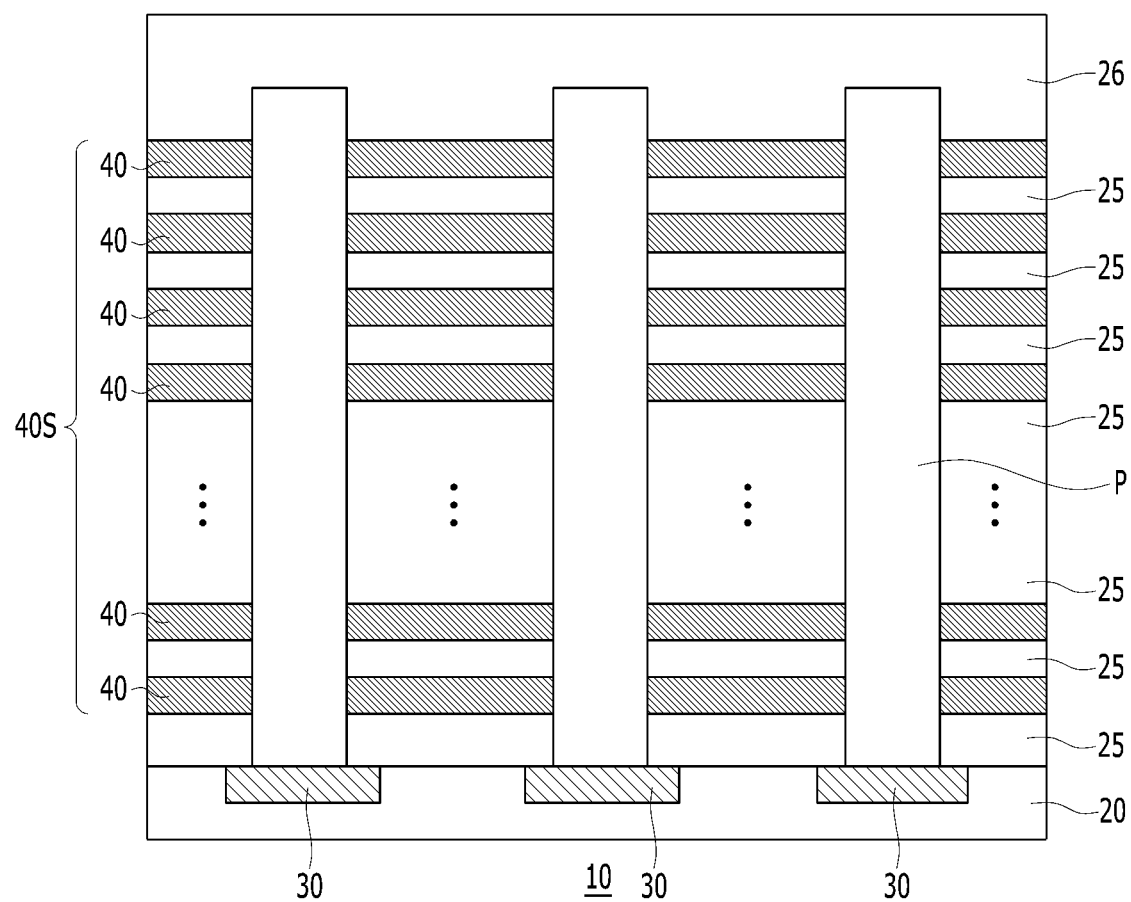
FIG. 7B is a schematic cross-sectional view of a semiconductor memory device, taken along the line V-V' of FIG. 6.

FIG. 7A is a schematic cross-sectional view of a semiconductor memory device, taken along the line IV-IV' of FIG. 6, and FIG. 7B is a schematic cross-sectional view of a semiconductor memory device, taken along the line V-V' of FIG. 6.

Referring to FIGS. 7A and 7B, the cell array 100B of the semiconductor memory device in accordance with the present embodiment may include a lower insulating layer 20 disposed on a substrate 10, word lines 30 arranged on or in the lower insulating layer 20, and cell pillars P, and bit line stacks 40S which are arranged over the word lines 30. Between the respective stacked bit lines 40, a plurality of interlayer dielectric layers 25 may be interposed, and an upper insulating layer 26 disposed on the uppermost bit line 40. Compared to the cell array 100A of the semiconductor memory device illustrated in FIGS. 3A and 3B, the word lines 30 may be arranged under the cell pillars P and the bit line stacks 40S. The word lines 30 may be insulated from the substrate 10 by the lower insulating layer 20. That is, the lower ends of the cell pillars P may be electrically coupled to the word lines 30, and the upper ends of the cell pillars P may float.

Figure 8A:
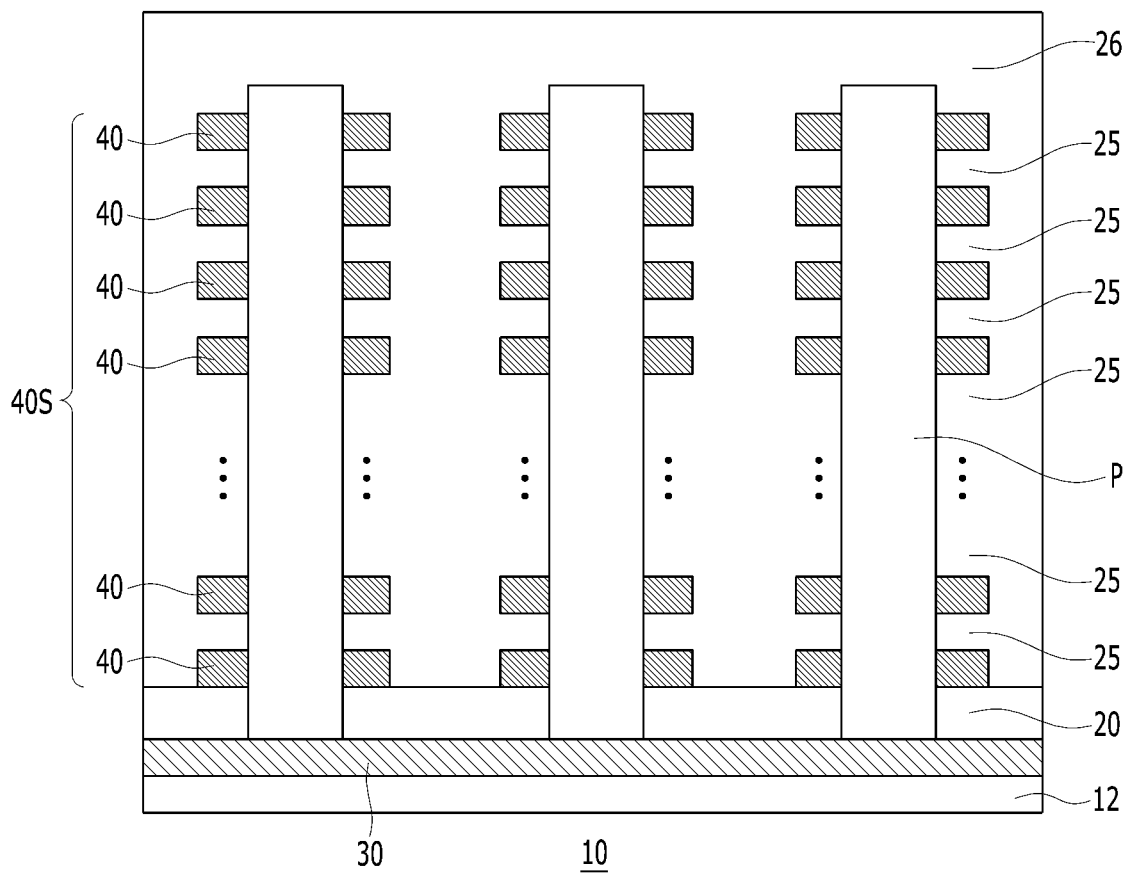
FIG. 8A is a schematic cross-sectional view of a semiconductor memory device, taken along the line IV-IV' of FIG. 6.

FIG. 6 can also be used to schematically illustrate a 3D perspective view of a cell array 100C. FIG. 8A is a schematic cross-sectional view of a semiconductor memory device in a cell array 100C, taken along the line IV-IV' of FIG. 6, and FIG. 8B is a schematic cross-sectional view of the semiconductor memory device in a cell array 100C, taken along the line V-V' of FIG. 6.

Figure 8B:
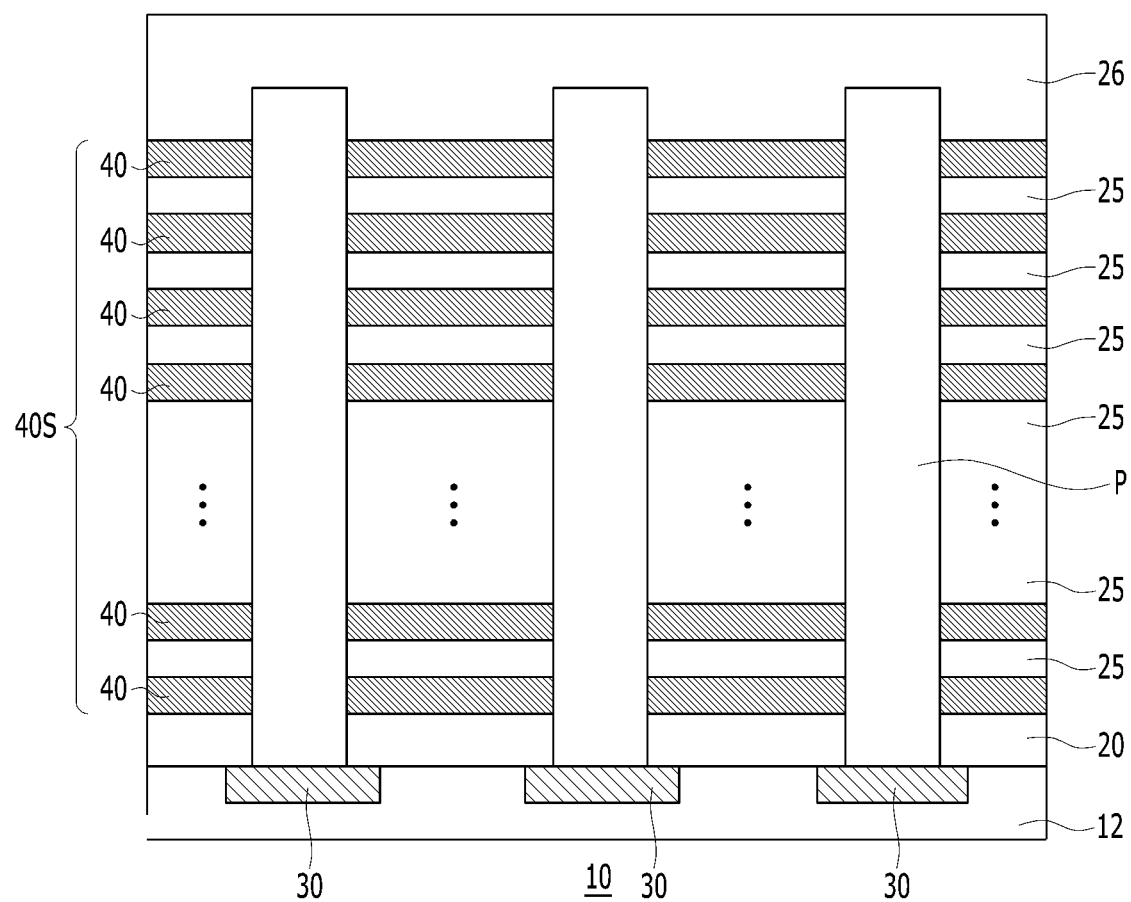
FIG. 8B is a schematic cross-sectional view of a semiconductor memory device, taken along the line V-V' of FIG. 6.

Referring to FIGS. 8A and 8B, a cell array 100C of the semiconductor memory device in accordance with the embodiment may include word lines 30 buried in a substrate 10, a lower insulating layer 20 disposed on the substrate 10, cell pillars P arranged on the word lines 30, and bit line stacks 40S. Between the respective stacked bit lines 40, a plurality of interlayer dielectric layers 25 may be interposed, and an upper interlayer insulating layer 26 disposed on the uppermost bit line 40. Compared to the cell array 100A of the semiconductor memory device illustrated in FIGS. 3A and 3B, the word lines 30 may be arranged under the cell pillars P and the bit line stacks 40S. The word lines 30 may be buried in the substrate 10. The word lines 30 may be ion doped regions in the substrate 10 or metal lines buried in the substrate 10. The word lines 30 may be electrically insulated from a bulk region of the substrate 10 by an insulating region 12 disposed in the substrate 10. The insulating region 12 may contain an insulating material including silicon oxide or silicon nitride. In another embodiment, the insulating region 12 may reflect an N-type ion or P-type ion doped region for forming a depletion region with any one of the word line 30 and the substrate 10.

Figure 9:
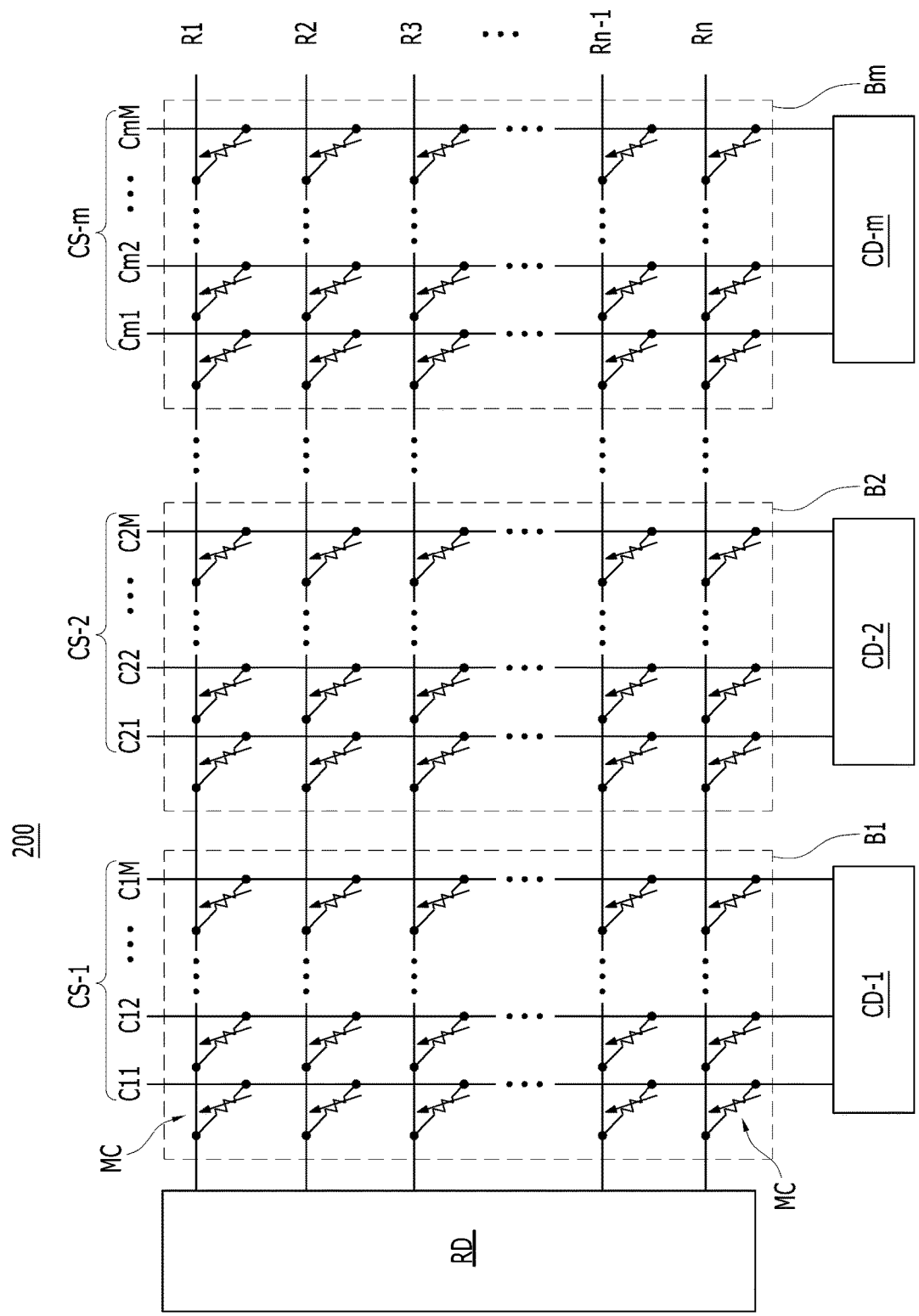
FIG. 9 is a block diagram schematically illustrating a cell array of a semiconductor memory device in accordance with an embodiment.

FIG. 9 is a block diagram conceptually illustrating a cell array 200 of a semiconductor memory device in accordance with an embodiment. Referring to FIG. 9, the cell array 200 of the semiconductor memory device may include a row driver RD, a plurality of column drivers CD-1 to CD-m, a plurality of row lines R1 to Rn, a plurality of column line sets CS-1 to CS-m, and a plurality of memory cells MC. The plurality of row lines R1 to Rn may be extended in parallel to each other in a row direction from the row driver RD, the plurality of column line sets CS-1 to CS-m may include a plurality of column lines C11 to CmM extended in parallel to each other in a column direction from the plurality of column drivers CD-1 to CD-m, and the plurality of memory cells MC may be arranged at the respective intersections between the row lines R1 to Rn and the column lines C11 to CmM. One of the column drivers CD-1 to CD-m and one of the column line sets CS-1 to CS-m may be connected to form one of a plurality of memory blocks B1 to Bm.

FIGS. 10A and 10B are 3D perspective views schematically illustrating cell arrays 200A and 200B of semiconductor memory devices in accordance with embodiments.

Referring to FIGS. 10A and 10B, the cell arrays 200A and 200B of the semiconductor memory devices may each include a plurality of word lines 30, a plurality of bit lines 40, and a plurality of cell pillars P. The word lines 30 may be extended in parallel to each other in a first direction D1.

The first direction D1 may indicate a horizontal row direction. The bit lines stacks 40S may include a plurality of bit lines 40 and may extend in a second direction D2. The second direction D2 may indicate a horizontal column direction. Each of the bit line stacks 40S may be included in a memory cell block B. The plurality of cell pillars P may extend in a third direction D3 and pass through the bit lines 40. The third direction D3 may indicate a substantially vertical direction.

Referring to FIG. 10A, the word lines 30 may be arranged over the bit line stacks 40S and the cell pillars P. Referring to FIG. 10B, the word lines 30 may be arranged under the bit line stacks 40S and the cell pillars P. The cell arrays 200A and 200B illustrated in FIGS. 10A and 10B may be further understood with reference to the descriptions of FIGS. 3A, 3B, 4A, 4B, 7A, 7B, 8A, and 8B.

In FIGS. 9, 10A, and 10B, one of the word lines 30 and a plurality of bit lines 40 may be electrically coupled to each other through one of the cell pillars P. Referring back to FIGS. 4A and 4B, each of the cell pillars P may have a plurality of memory cells MC in the area of intersections between the word line 30 and the bit lines 40. Therefore, the plurality of memory cells MC corresponding to the area of intersection between one word line 30 and a bit line stack 40S may output a plurality of data through the plurality of bit lines 40. The one word line 30 may be further electrically coupled to a plurality of blocks B. When the plurality of blocks B are driven at different voltage levels, respectively, the cell arrays 200A and 200B may operate using only one block B or a plurality of selected blocks B. Therefore, the driving efficiency and speed of the semiconductor memory device can be improved, and multiple data levels can be implemented.

Figure 11:
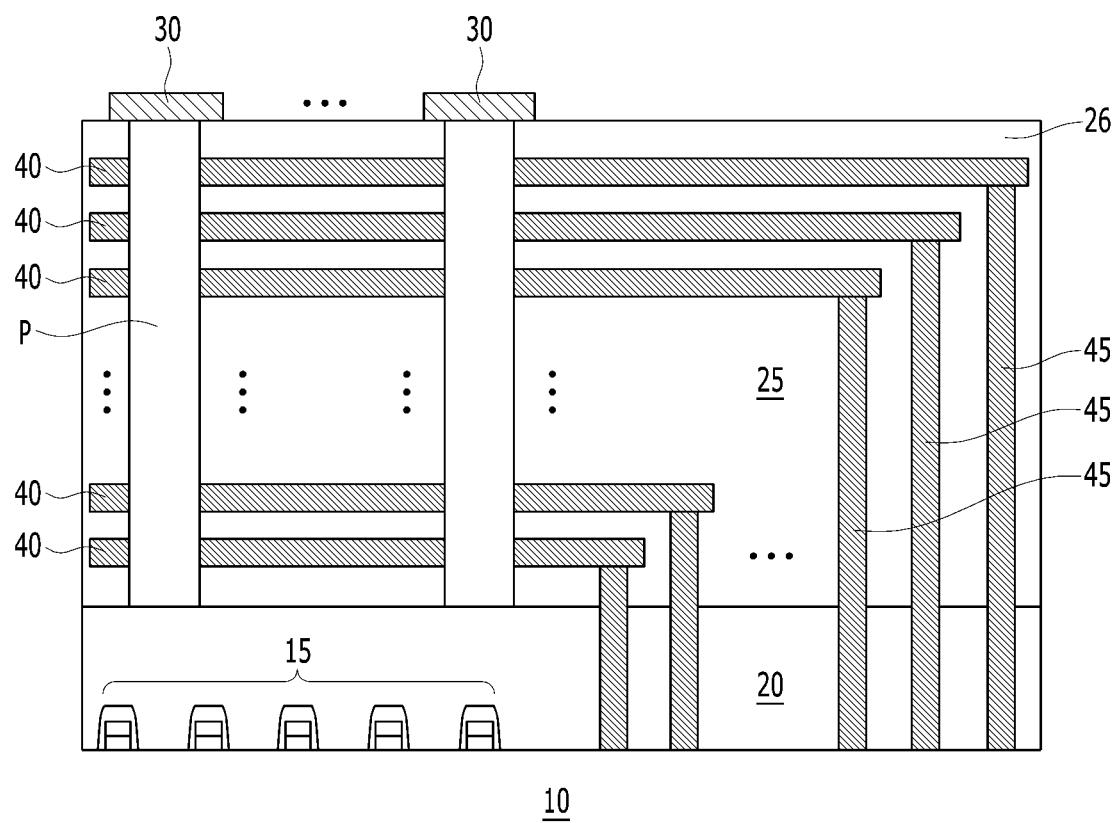
FIG. 11 is a schematic cross-sectional view of a semiconductor memory device in accordance with an embodiment.

FIG. 11 is a schematic cross-sectional view of a semiconductor memory device in accordance with an embodiment.

Referring to FIG. 11, the semiconductor memory device in accordance with an embodiment may include a circuit unit 15 disposed on a substrate 10, a lower insulating layer 20, bit lines 40, and interlayer dielectric layers 25, with bit lines 40 and interlayer dielectric layers 25 stacked over the lower insulating layer 20, cell pillars P pass or extend vertically through the bit lines 40 and the interlayer dielectric layers 25, word lines 30 disposed on the cell pillars P, and via plugs 45 for electrically coupling the bit lines 40 to the circuit unit 15.

The circuit unit 15 may include a plurality of transistors. For example, the circuit unit 15 may include a logic circuit, pre-synaptic circuit and/or post-synaptic circuit. The via plugs 45 may include a conductor. For example, the via plugs 45 may include a metal such as W, Ru, Cu or Al. In other embodiments, the via plugs 45 may include one of a metal compound such as WN, TiN, TaN or $RuO_2$, a metal silicide such as WSi, TiSi, NiSi or CoSi, or an ion doped silicon.

Active regions for electrically coupling the transistors to the via plugs 45 may be disposed in the substrate 10. For example, ion doped regions may be created.

Since the word lines 30, the bit lines 40, and the cell pillars P are located over the circuit unit 15, the degree of integration can be increased. Furthermore, the circuit unit 15 and the cell array which are vertically arranged can reduce the electrical signal path, thereby improving the operating speed.

Figure 12:
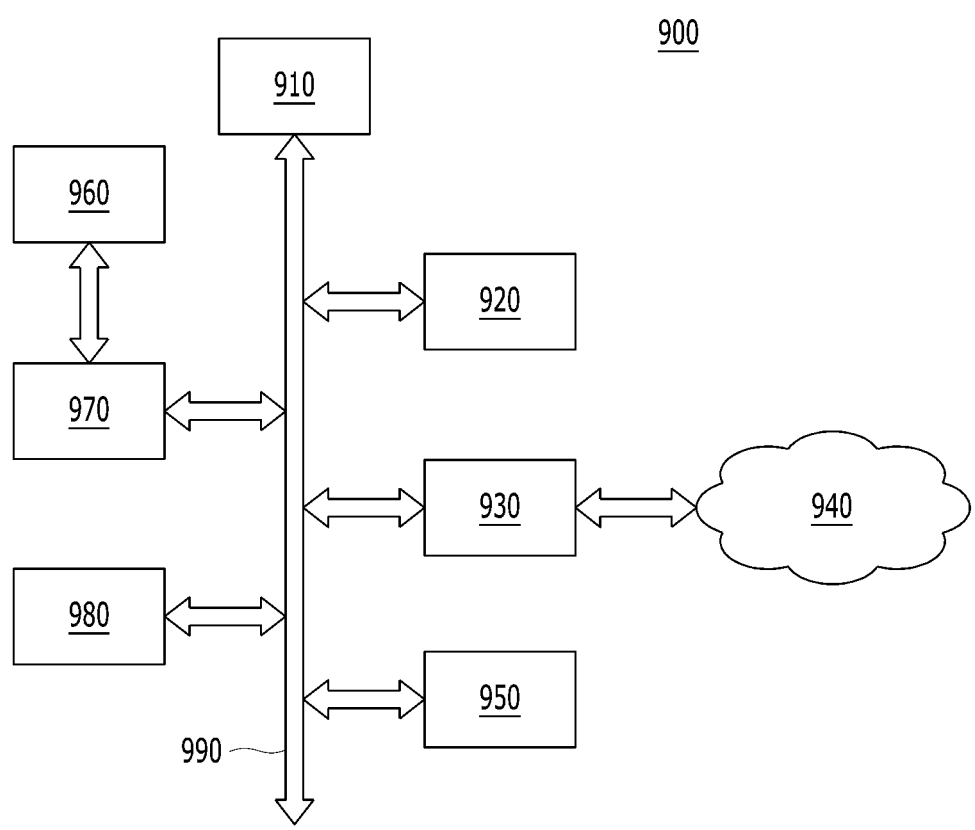
FIG. 12 is a block diagram schematically illustrating a pattern recognition system in accordance with an embodiment.

FIG. 12 is a block diagram conceptually illustrating a pattern recognition system 900 in accordance with an embodiment. For example, the pattern recognition system 900 may include a speech recognition system, imaging recognition system, code recognition system, signal recognition system or one of systems for recognizing various patterns.

Referring to FIG. 12, the pattern recognition system 900 in accordance with the present embodiment may include a CPU 910, a memory unit 920, a communication control unit 930, a network 940, an output unit 950, an input unit 960, an analog-digital converter (ADC) 970, a neuromorphic unit 980 and/or a bus 990. The CPU 910 may generate and transfer various signals for a learning process of the neuromorphic unit 980, and perform various processes and functions for recognizing patterns such as speech and image according to an output from the neuromorphic unit 980.

The CPU 910 may be connected to the memory unit 920, the communication control unit 930, the output unit 950, the ADC 970, and the neuromorphic unit 980 through the bus 990.

The memory unit 920 may store various pieces of information which need to be stored in the pattern recognition system 900. The memory unit 920 may include one or more of a volatile memory such as DRAM or SRAM, a nonvolatile memory such as PRAM, MRAM, ReRAM or NAND flash memory, and various memory units such as a hard disk drive (HDD) and solid state drive (SSD).

The communication control unit 930 may transmit and/or receive data such as recognized speech and image to and/or from the communication control unit of another system through the network 940.

The output unit 950 may output the data such as the recognized speech and image in various manners. For example, the output unit 950 may include a speaker, printer, monitor, display panel, beam projector, hologrammer or other various output devices.

The input unit 960 may include one or more of a microphone, camera, scanner, touch pad, keyboard, mouse, mouse pen, and various sensors.

The ADC 970 may convert analog data inputted from the input unit 960 into digital data.

The neuromorphic unit 980 may perform learning or recognition using the data outputted from the ADC 970, and output data corresponding to recognized patterns. The neuromorphic unit 980 may include one or more of the neuromorphic devices in accordance with the various embodiments.

The semiconductor memory device and the neuromorphic device in accordance with the present embodiments may have a high degree of integration.

The semiconductor memory device and the neuromorphic device in accordance with the present embodiments may have high operating speed and low power consumption.

Although various embodiments have been described for illustrative purposes, it will be apparent to those skilled in the art that various changes and modifications may be made without departing from the spirit and scope of the invention as defined in the following claims.

What is claimed is:

1. A semiconductor memory device comprising:
a plurality of row lines extended in parallel to each other in a first horizontal direction;
a plurality of column line stacks extended in parallel to each other in a second horizontal direction perpendicular to the first horizontal direction, wherein each of the plurality of column line stacks comprises a plurality of column lines extended in parallel to each other in the second horizontal direction and stacked in a vertical direction; and
a plurality of cell pillars that pass vertically through the column lines of the column line stacks, each of the plurality of cell pillars has a first end and a second end,
wherein the first ends of the plurality of cell pillars are electrically coupled to the plurality of row lines,
wherein the second ends of the plurality of cell pillars are floated,
wherein the second ends of the plurality of cell pillars protrude from lowermost column lines of the plurality of column line stacks, and
wherein the second ends of the plurality of cell pillars are not coupled to other conductive components.

2. The semiconductor memory device of claim 1, wherein the plurality of row lines comprise at least one of a metal, a metal compound, a metal silicide, and an ion doped silicon.

3. The semiconductor memory device of claim 1, wherein each of the plurality of cell pillars comprises:
a central core; and
a memory layer surrounding the core.

4. The semiconductor memory device of claim 3, wherein the central core comprises at least one of a metal, metal compound, and metal silicide.

5. The semiconductor memory device of claim 4, wherein the central core comprises at least one of a metal, a metal compound, a metal silicide, and an ion doped silicon.

6. The semiconductor memory device of claim 3, wherein the central core is directly connected to one of the plurality of row lines.

7. The semiconductor memory device of claim 3, wherein the memory layer comprises at least three variable resistance layers, and the variable resistance layers have at least one or more different characteristics among energy band gaps, chemical potentials, ion mobilities, filament formation threshold voltages, phase change threshold voltages, and atom transfer threshold voltages.

8. The semiconductor memory device of claim 7, wherein each of the variable resistance layers comprises at least one of hafnium oxide, aluminum oxide, lanthanum oxide, tantalum oxide, silicon oxide, and titanium oxide.

9. The semiconductor memory device of claim 1, wherein each of the plurality of column lines comprises at least one of a metal, a metal compound, a metal silicide, and an ion doped silicon.

10. The semiconductor memory device of claim 1, wherein the plurality of row lines are buried in a substrate.

11. A semiconductor memory device comprising:
a word line extended in a first horizontal direction;
a bit line stack extended in a second horizontal direction perpendicular to the first horizontal direction; and
a cell pillar extended from the word line to vertically pass through the bit line stack,
wherein a first end of the cell pillar is electrically coupled to the word line, and
a second end of the cell pillar is floated,
wherein the bit line stack comprises a plurality of bit lines which are stacked in a vertical direction and are extended in parallel to each other in the second horizontal direction,
wherein the second end of the cell pillar protrudes from a lowermost end of the bit line stack, and
wherein the second end of the cell pillar is not coupled to other conductive components.

12. The semiconductor memory device of claim 11, wherein the plurality of bit lines comprise at least one of a metal, a metal compound, a metal silicide, and an ion doped silicon.

13. The semiconductor memory device of claim 11, wherein the cell pillar comprises a central core and a memory layer surrounding the core.

14. The semiconductor memory device of claim 13, wherein the memory layer comprises at least three variable resistance layers, and the variable resistance layers have at least one different characteristic among energy band gaps, chemical potentials, ion mobilities, filament formation threshold voltages, phase change threshold voltages, and atom transfer threshold voltages.

15. The semiconductor memory device of claim 14, wherein the variable resistance layers comprise at least one of hafnium oxide, aluminum oxide, lanthanum oxide, tantalum oxide, silicon oxide, and titanium oxide.

16. The semiconductor memory device of claim 11, wherein the word line comprises at least one of a metal, a metal compound, a metal silicide, and an ion doped silicon.

17. The semiconductor memory device of claim 13, wherein the central core comprises at least one of a metal, metal compound, and metal silicide.

18. The semiconductor memory device of claim 13, wherein the central core is directly connected to the word line.

19. A semiconductor memory device comprising:
   a substrate;
   a lower insulating layer disposed over the substrate;
   a plurality of bit lines and a plurality of interlayer dielectric layers which are alternately stacked over the lower insulating layer, wherein the plurality of bit lines are extended in parallel to each other in a first horizontal direction;
   an upper insulating layer disposed over the plurality of bit lines;
   a word line disposed over the upper insulating layer and extended in a second horizontal direction perpendicular to the first horizontal direction; and
   a vertical pillar extended vertically from the word line through the upper insulating layer, the plurality of interlayer dielectric layers, and the plurality of bit lines,
   wherein the vertical pillar comprises a conductive core and at least three variable resistance layers surrounding the core,
   an upper end of the vertical pillar is directly connected to the word line; and
   a lower end of the vertical pillar protrudes into the lower insulating layer not to contact the substrate.

20. The semiconductor memory device of claim 19, wherein the variable resistance layers comprise at least one of hafnium oxide, aluminum oxide, lanthanum oxide, tantalum oxide, and titanium oxide, and wherein the variable resistance layers have at least one different characteristic among energy band gaps, chemical potentials, ion mobilities, filament formation threshold voltages, magnetization threshold voltages, phase change threshold voltages, and atom transfer threshold voltages.

* * * * *